(12) United States Patent
Jain et al.

(10) Patent No.: US 6,621,044 B2
(45) Date of Patent: Sep. 16, 2003

(54) DUAL-BEAM MATERIALS-PROCESSING SYSTEM

(75) Inventors: Kanti Jain, Hawthorne, NY (US); Robert S. Sposili, New York, NY (US); Marc A. Klosner, White Plains, NY (US); Marc I. Zemel, West Harrison, NY (US)

(73) Assignee: Anvik Corporation, Hawthorne, NY (US)

( * ) Notice: Subject to any disclaimer, the term of this patent is extended or adjusted under 35 U.S.C. 154(b) by 399 days.

(21) Appl. No.: 09/764,571

(22) Filed: Jan. 18, 2001

(65) Prior Publication Data

US 2002/0130279 A1 Sep. 19, 2002

(51) Int. Cl.[7] ................................................ B23K 26/67
(52) U.S. Cl. ................................... 219/121.7; 250/492.1
(58) Field of Search .................... 250/492.1; 219/121.7, 219/121.71, 121.77, 121.11

(56) References Cited

U.S. PATENT DOCUMENTS

| | | | | | |
|---|---|---|---|---|---|
| 5,523,543 | A | * | 6/1996 | Hunter et al. | 219/121.71 |
| 5,559,338 | A | * | 9/1996 | Elliott et al. | 250/492.1 |
| 6,120,976 | A | * | 9/2000 | Treadwell et al. | 430/322 |
| 6,172,329 | B1 | * | 1/2001 | Shoemaker et al. | 219/121.71 |
| 6,313,435 | B1 | * | 11/2001 | Shoemaker et al. | 219/121.7 |
| 6,433,301 | B1 | * | 8/2002 | Dunsky et al. | 219/121.7 |
| 6,462,306 | B1 | * | 10/2002 | Kitai et al. | 219/121.77 |

* cited by examiner

*Primary Examiner*—Jack Berman
*Assistant Examiner*—Johnnie L Smith, II
(74) *Attorney, Agent, or Firm*—Carl C. Kling (57) ABSTRACT

Apparatus and method for patterned sequential lateral solidification of a substrate surface, avoiding the need for demagnification to avoid mask damage from fluence sufficient to overcome the threshold for sequential lateral solidification, while using the high throughput of a common stage presenting both 1:1 mask and substrate simultaneously for patterning. The radiation source provides imaging beam and non-imaging beam, each of fluence below the threshold of sequential lateral solidification, but with aggregate fluence above the threshold. The imaging beam path includes a relatively delicate 1:1 mask and 1:1 projection subsystem, with optical elements including a final fold mirror proximate to the substrate surface, put the below-threshold mask pattern on the substrate surface. The non-imaging beam bypasses the delicate elements of imaging beam path, passing through or around the final fold mirror, to impinge on the substrate surface at the same location. Where the radiation patterns of the masked imaging beam and non-imaging beam coincide, their aggregate fluence exceeds the threshold for sequential lateral solidification. The dual selection provides pattern without damage to delicate optical elements.

36 Claims, 8 Drawing Sheets

DUAL-BEAM MATERIALS-PROCESSING SYSTEM

(B) CROSS-REFERENCE TO RELATED APPLICATIONS (NONE)

(C) STATEMENT REGARDING FEDERALLY SPONSORED RESEARCH OR DEVELOPMENT (NONE)

(D) REFERENCE TO A MICROFICHE APPENDIX (NONE)

(E) BACKGROUND OF THE INVENTION

(1) Field of the Invention

This invention relates to a dual-beam materials-processing system for applying two collinear and coincident controlled pulses of radiation to materials for making physical changes; and more particularly, relates to a means for obtaining high-fluence patterned irradiation that is highly uniform, and highly controllable in shape, intensity, and pulse duration to achieve high resolution imaging for materials processing—without feeding a high fluence through the imaging system.

(2) Description of Related Art

Several techniques have been developed for converting thin amorphous silicon films into polycrystalline films. See Im and Sposili, *Materials Research Society Bulletin*, 21, 39 (1996). This is desirable because better-performing thin-film transistor (TFT) devices can be fabricated from crystalline silicon than from amorphous silicon, and it is not possible to deposit silicon films directly in a high-quality crystalline state. Among the various crystallization techniques, those based on excimer laser irradiation (or pulsed-laser irradiation more generally) are prevalent because they are compatible with substrates that cannot withstand high-temperature processing; the techniques can be applied when the silicon film to be crystallized is deposited on such a substrate. Glass and other substrates that cannot withstand high-temperature processing (e.g., plastics) are required for use in many TFT applications, for example, in displays.

Sequential lateral solidification (SLS) is a particular type of excimer laser crystallization process that can produce previously unavailable large-grained and grain-boundary-location-controlled microstructures in thin silicon films. The technique is well documented; see Sposili and Im, *Applied Physics Letters*, 69, 2864 (1996); Sposili and Im, *Applied Physics A*, A67, 273 (1998); Im, Sposili et al., *Applied Physics Letters*, 70, 3434 (1997); Sposili, Crowder et al., *Mater. Res. Soc. Symp. Proc.*, 452, 953 (1997); and Im, Crowder et al., *Physica Status Solidi A*, 166, 603 (1998). Films having these microstructures are superior to the types of random-microstructure polycrystalline silicon produced by other excimer laser crystallization processes (and by non-excimer-laser-based crystallization processes as well) in that the TFTs exhibit a combination of superior electronic performance (e.g., higher carrier mobility) and a high level of device-to-device uniformity. The availability of high-performance TFT devices enables numerous applications, such as integrated active-matrix liquid-crystal displays (IAMLCDs), where the driver circuits and other electronics are integrated directly onto the substrate along with the pixel-controlling transistors, and active-matrix organic light-emitting displays (AMOLEDs), among others.

SLS requires that the silicon film be completely melted in and only in a micron-sized spatially controlled region or regions with each irradiation, and that the film be translated with sub-micron precision in between irradiations such that the lateral crystallization induced by each irradiation overlaps with that produced previously. Various schemes have been proposed for conducting the SLS process, and different approaches exist for effecting the requisite spatial tailoring of the beam. Projection irradiation is a very flexible method, wherein a patterned mask is imaged onto the film in order to define the location and extent of the molten zones. Generally, any projection SLS system would contain the following elements: a pulsed-laser source, typically an excimer laser; an illumination system, including a homogenizer, to provide uniform illumination of the mask; an imaging system to image the mask pattern onto the film; and a high-precision sub-micron sample-translation system.

Such SLS projection systems are similar in many respects to photolithography and ablation systems based on excimer lasers; the basic components listed above are common to all. While the various components and subsystems have the same general purpose for each type of projection system, the requirements of the processes differ and therefore so does the configuration of the subsystems.

An excimer laser projection system designed for SLS requires a high fluence—sufficient to completely melt a silicon film in the exposed region or regions. Unlike in lithography and ablation, in which the desired material changes can be effected equally well whether the required dose is delivered in a single irradiation or distributed over several irradiations, the physics of melting and solidification involved in the SLS process requires that the dose be delivered in a single irradiation. As a consequence of this fact, combined with the high energy density needed to heat silicon above its melting point of approximately 1,400° C., successful execution of the SLS process requires that the films be irradiated at very high fluence.

The dual requirements of high fluence and projection imaging with micron-scale patterning present an engineering challenge because the mask materials commonly used, such as chrome-on-quartz, cannot withstand the level of fluence required to melt the silicon films. Conventional SLS system designs use demagnification to address this difficulty; the projection lens is designed to demagnify the image of the mask features. In this way, the fluence at the mask plane can be kept below the mask-damage threshold while achieving high fluence at the silicon film. Neglecting optical losses in the imaging system, the fluence at the silicon film (image plane) will be greater than the fluence at the mask plane (object plane) by a factor of the demagnification squared.

In a previously submitted patent, we described a number of innovations for SLS equipment including a novel illumination subsystem, which produces a self-luminous beam of selected cross-section, spatially uniform intensity, and selected numerical aperture; and a high-efficiency energy-recycling exposure system, which extends the duration of radiation pulses and conserves energy. The importance of these innovations can be understood in connection with the high-fluence requirements for SLS, and additionally in connection with the requirement that such high-fluence irradiation be spatially homogenous within the irradiated regions. If the intensity is too low in particular regions, the film will not melt completely, leading to failure of the process; if the intensity is too high, film damage can occur. In the previous patent, these inventions were described in the context of a conventional SLS system, of the type that utilizes demagnification imaging to keep the fluence level at the mask plane below the damage threshold of the mask materials. However, the utility of the inventions described in the previous patent is not limited specifically to the conventional SLS system design; rather the benefits of the previous invention are equally applicable to the type of system described herein.

Although demagnification is commonly used to address the fluence-limitation issues of SLS equipment, there are advantages to conducting the SLS process using equipment modeled after Anvik's large-area, 1:1-magnification patterning systems rather than using the conventional reduction design.

Figure 1:
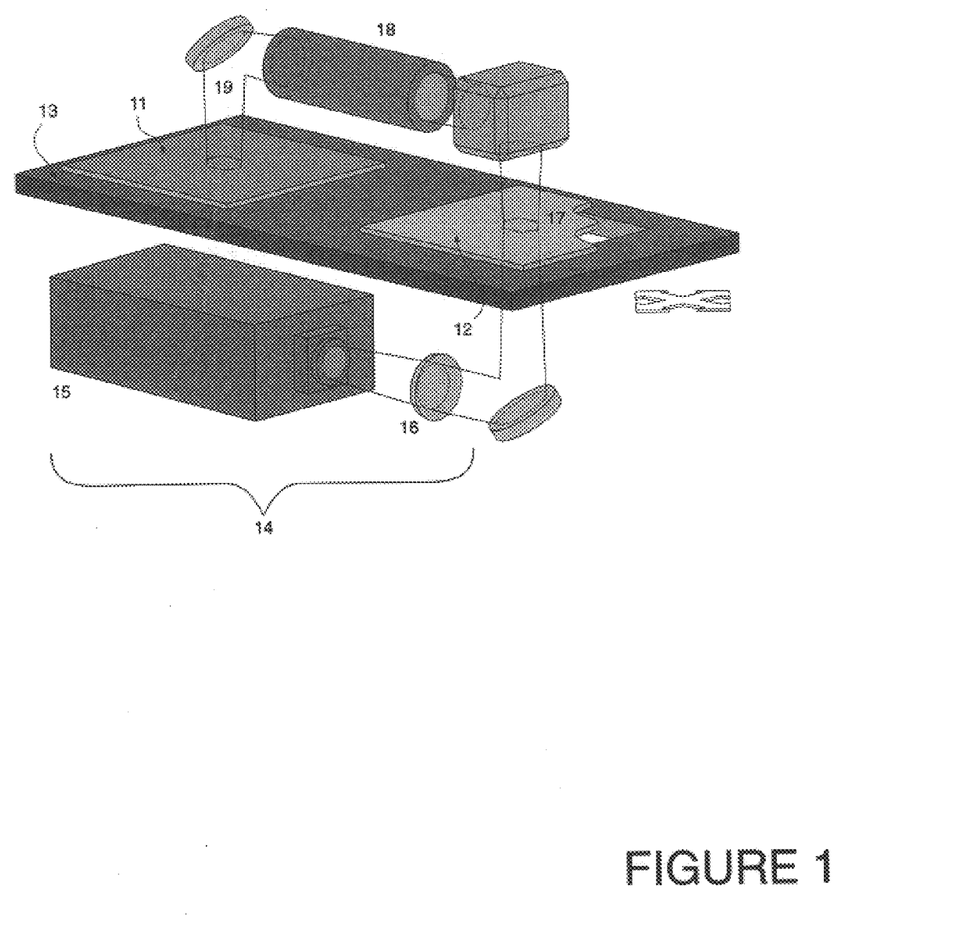
FIG. 1 is a schematic of a Anvik's HexScan™ lithography technology, showing scanning with a single-planar stage and hexagonal beam.

Anvik's large-area patterning technology is based on the Jain design [1-4] and is schematically illustrated in FIG. 1. The substrate 11 and the mask 12 are rigidly mounted on a single-planar scanning stage 13 that is capable of moving them in synchronism in both x- and y-directions. The illumination system 14 comprises an excimer laser light source 15 and a beam-processing optical system 16. The excimer laser 15 emits several tens of watts of UV radiation at 351 nm, a wavelength well-suited for imaging conventional photoresists designed for mercury arc lamp exposure. The systems can also be configured to use an excimer laser operating at 308 nm or 248 nm, depending on the application. The laser emits no infrared or other unwanted radiation. The beam-processing system illuminates the mask 12 from below (through a cutout in the stage) in a uniform, hexagon-shaped illumination region 17 that is typically 50 mm in size (vertex-to-vertex).

The mask pattern within the illuminated hexagonal region is imaged onto the substrate 11 by a unit-magnification projection lens 18 through a folded image path 19. The projection lens 18, the illumination system 14, and all other optical components are stationary, as are all the light rays. The sole moving component is the single-planar stage 13, which is scanned in a serpentine fashion in the x-y plane so that the following sequence of events happens: the mask 12 and substrate 11 scan in unison along the x-axis across their respective hexagonal illumination regions; the stage 13 moves them along y by an amount equal to the effective scan width w (typically 35–40 mm); the mask 12 and substrate 11 scan again along x (but in the opposite direction); they again move laterally by w along y, and the process is repeated until the entire substrate 11 is imaged. The hexagonal illumination configuration ensures that the whole exposure is completely seamless and uniform.

In order to understand the reason for the advantage of SLS systems based on the Anvik technology over conventional systems, it is necessary to consider that SLS is an intrinsically flexible crystallization method that can be implemented using many different schemes and configurations— i.e., different beam patterns and irradiation/translation sequences. Depending on the details of the SLS scheme, the SLS process can produce a wide variety of low-defect-density crystalline microstructures, ranging from large-grained polycrystalline to single-crystal islands. As is well known, the performance of electronic devices depends very strongly on the microstructure of the semiconductor on which they are fabricated. Consequently, different SLS schemes will provide varying levels of device performance depending on the microstructural result.

In addition to determining the microstructure, the choice of the SLS scheme will also affect important processing characteristics, such as the throughput. In general, the selection of the SLS scheme for a particular application will be based primarily on the microstructural requirements—as determined by the requisite level of device performance— and secondarily on the optimization of the process, particularly the throughput.

It is important to note also that the choice of SLS scheme is closely tied to the configuration of the equipment: Certain equipment designs are better suited for implementation of particular schemes. The conventional (demagifying) SLS system, in conjunction with certain SLS schemes, is well-suited for producing a particular large-grained, directionally solidified polycryststalline microstructure known as "SLS-poly," and for doing so at high throughput. This microstructure provides a moderate level of device performance that is expected to be adequate for current TFT applications.

However, it is anticipated that future applications will require a higher level of performance than the SLS-poly microstructure can provide, and no scheme has been conceived for producing microstructures associated with better device performance at high throughput using the conventional SLS equipment. In contrast, the Anvik-style system, used in conjunction with SLS processing schemes that are not compatible with conventional equipment, and which will be described in a later section, can provide superior material at high throughput.

Unlike the conventional design, this technology requires that the imaging be done at 1:1 (i.e., no demagnification). However, the high fluence at the mask plane poses a serious problem for the implementation of 1:1 imaging for SLS. The high fluence required to melt the silicon films will damage commonly available mask materials; even the most resistant mask materials currently available are not expected to survive a large number of irradiations at such high fluence.

Accordingly, there exists a need in the field for a 1:1 projection imaging system that is compatible with Anvik's large-area patterning technology and that can deliver high fluences at the image plane (e.g., as required for SLS) at the requisite level of imaging resolution without requiring that the mask plane be subjected to similarly high fluences.

(F) BRIEF SUMMARY OF THE INVENTION

The invention is a system for materials processing through projection irradiation using a pulsed laser source— particularly for conducting the sequential lateral solidification (SLS) process on substrates, including large-area substrates, containing a thin surface layer of material to be crystallized, typically but not limited to amorphous silicon (a-Si). The system is capable of generating a high-resolution image at high fluence without subjecting the imaging system itself to high fluence. It does so by generating two beams, one of which is passed through an imaging system while the other is introduced as uniform flood irradiation over the imaging field. The superposition of the two beams produces an imaged beam of high fluence. The material, commonly referred to as the substrate, is made available at a work station for processing by a patterned laser beam. The system typically includes mechanisms for positioning and translating large-area substrates. The positioning generally includes a schedule of scanning and stepping that is coordinated with the irradiation in a manner consistent with the requirements of the particular process being conducted. During the scanning motion, the system at the same time provides controlled laser pulses, modifying the laser radiation in two separate illumination subsystems, and projecting patterned, modified laser radiation along one of the two optical paths to a carefully controlled area on the surface of the substrate.

The desire is to create desirable microstructures in the film, such as large-grained, grain-boundary-location-controlled polycrystals and large single-crystal islands at selected locations on the substrate.

The output of a single laser—a train of pulses controlled in energy and repetition rate—is split in two by a variable beam-splitter (VBS), which allows for adjustment of the split of the beam energy between the two sub-beams. Alternately, two lasers are used to generate two separate beams of different wavelengths. Both of the two optical paths contain illumination systems comprising three modular units: a set of anamorphic beam-shaping optics, a homogenizer, and a set of condenser lenses. The illumination systems reshape and homogenize the beam, and provide uniform self-luminous illumination in the desired shape—typically a high-aspect-ratio rectangle. The homogenizer is a tubular structure with fully mirrored walls and a polygonal cross-section. The many mirror surfaces of the homogenizer provide multiple reflections; the caroming about of the beam within the homogenizer converts the incident beam into spatially homogenized, self-luminous illumination at the output aperture. The homogenizer may also incorporate Anvik's energy-recycling technology, which recovers energy reflected off of the mask that otherwise would have been lost, and reintroduces it into the illumination. The energy recycler also extends the laser pulse duration by 15–30%; otherwise-wasted laser power is conserved, and there is an opportunity to control pulse duration quite effectively.

Along the imaging path, the uniform illumination is imaged onto a mask, which in turn is imaged by a projection lens onto the sample. In the non-imaging path, the uniform illumination is imaged directly onto the sample. Various schemes, such as having a physical or optical hole in the final folding mirror, or a dielectric coating that reflects one wavelength but transmits another, can be used to render the beams coincident as they impinge on the sample. The superposition of the two beams provides an image of enhanced fluence—equal to the arithmetic combination of the two beams. The system does so without subjecting the mask and imaging system to high fluence. Areas within the image field that do not contain any patterned features receive only the uniform illumination dose from the non-imaging branch. A significant portion of the high-fluence beam energy within the patterned areas is absorbed by the substrate and effects a physical change, usually through a thermal mechanism as a result of localized intense heating. However, other modes of interaction between the beam and the substrate are possible, depending on the specific substrate material and the wavelength of the laser radiation. The level of uniform illumination from the non-imaging branch will generally be adjusted so as to be below the threshold for the operative physical change, and may only serve to effect some amount of low-level heating of the film.

The localized intense heat is useful in many materials-processing operations, including those involving localized melting and resolidification, such as ELA in general and SLS in particular, and dopant activation, as well as those involving localized ablation and removal of material.

The object of the invention is to provide a high-fluence, shaped, spatially homogenized, duration-controlled, and carefully imaged radiation beam at the chosen area or areas of the substrate, which can be translated in an extremely precise and controllable manner in coordination with the irradiation, in order to accomplish the desired physical change for materials processing—particularly SLS.

Another object of the invention is to provide a high-fluence, high-resolution patterned radiation beam using 1:1 projection imaging (no demagnification) without exposing the mask and imaging system to high-fluence radiation.

Yet another object of the invention is to provide a practical system for conducting the SLS process using Anvik's large-area 1:1 patterning technology.

A feature of the invention is the use of a novel optical system, which provides two beams from a single laser that irradiate the sample concurrently.

Another feature of the invention is the use of two lasers operating at different wavelengths. A low- to moderate-power laser feeds the imaging path of the system, and a high-power laser feeds the non-imaging path of the system.

Yet another feature of the invention is the confluence of two separate irradiation beams incident collinearly onto the sample.

An advantage of the invention is the ability to perform 1:1 image-based materials processing at very high fluence.

Another advantage of the invention is the prolonging of mask life as a result of the reduction in fluence through the imaging system.

Other objects, features and advantages of the invention will be apparent from the following written description, claims, abstract, and the annexed drawings.

References
1. K. Jain, "Scan and Repeat, High-Resolution Lithography System," U.S. Pat. No. 4,924,257, issued May 8, 1990.
2. K. Jain, "A Novel High-Resolution, Large-Field, Scan-and-Repeat, Projection Lithography System," Proc. SPIE, Vol. 1463, p. 666, 1991.
3. K. Jain, "Large-Area, High-Throughput, High-Resolution, Projection Imaging System," U.S. Pat. No. 5,285,236, issued Feb. 8, 1994.
4. K. Jain, "High-Throughput, High-Resolution, Projection Patterning System for Large, Flexible, Roll-Fed Electronic-module Substrates," U.S. Pat. No. 5,652,645, issued Jul. 29, 1997.

(G) BRIEF DESCRIPTION OF THE SEVERAL VIEWS OF THE DRAWING

FIGS. 7(A & B) are schematics showing folding mirrors with holes—variously physical or optical—that enable coincident irradiation using dual beams.

FIGS. 9(A–C) are schematics showing several concepts for a variable beam-splitter (VBS) to be incorporated in the dual-beam 1:1 materials-processing systems described in FIGS. 2 and 6.

(H) DETAILED DESCRIPTION OF THE INVENTION

Figure 2:
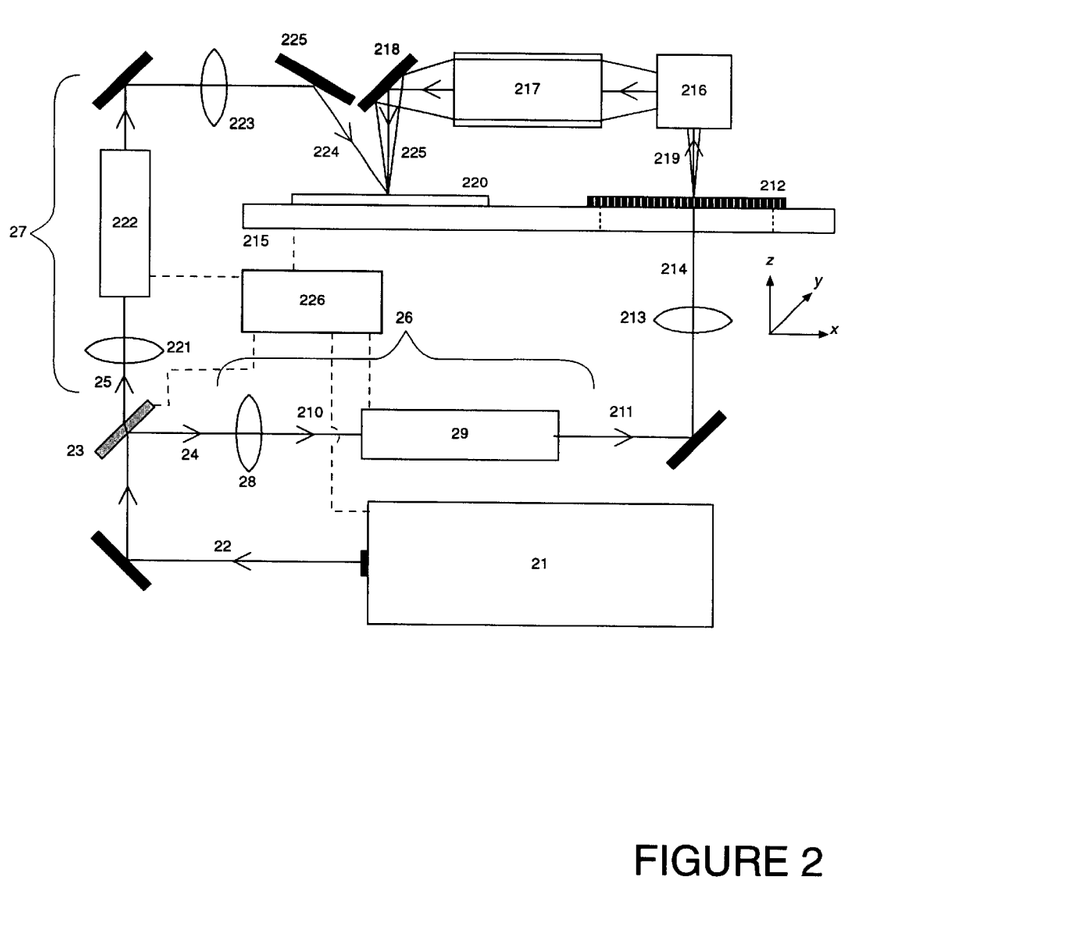
FIG. 2 is a schematic of a dual-beam, 1:1-imaging materials-processing system based on the Anvik's design.

FIG. 2 shows a preferred embodiment of the invention, a high-resolution, pulsed-laser irradiation tool for effecting localized physical changes to a substrate that is based on Anvik's large-area patterning technology: incorporating 1:1 imaging and a single-planar stage. It includes a laser 21, which is preferably a XeCl excimer laser operating at a wavelength of 308 nm with a nominal pulse duration of 30 ns FWHM and a pulse repetition rate that can be varied between one and several hundred pulses per second (Hz). The output beam 22 of the laser 21 passes through a beam-splitter 23, which is preferably a fused silica plate with a multi-layer dielectric coating designed to reflect a fixed portion of the beam, and to transmit the remainder. Beam-splitter 23 divides the laser beam between two optical branches: an imaging branch 24 and a non-imaging branch 25.

There are two illumination subsystems, 26 and 27, for the imaging and non-imaging optical branches, respectively. Each illumination system comprises a set of anamorphic beam-shaping optics, which reshape the rectangular laser beam into a form well-matched to the input aperture of the homogenizer (e.g., a square cross-section); a homogenizer to improve the spatial uniformity of the beam, which may incorporate energy recycling; a condenser lens set to image the spatially uniform output of the homogenizer, and optionally, an energy attenuator for fine control of the beam energy, for example based on a dielectric-coated transparent plate whose transmission is incident-angle-dependent.

Considering imaging branch 24, the beam transmitted by the beam-splitter 23 passes into the beam-shaping module 28, which uses telescopic optics to modify the shape of the raw beam into a form well-matched to the input aperture of the homogenizer 29. The beam-shaping module 28 includes a focusing lens for providing a highly divergent beam for input into the homogenizer 29. The output beam 210 of the beam-shaping module is input into the homogenizer 29, wherein multiple reflections and recombinations effect superposition of different segments of the input beam, leading to spatial uniformity of the intensity. The degree of uniformity is determined by the number of reflections that the beam segments make within the body of the homogenizer 29. The shape of the illumination can be controlled through the design of the homogenizer cavity; the illumination will have the shape of the cavity cross-section, which can be built in many different shapes, usually polygonal, as described in U.S. Pat. No. 5,828,505. For example, the homogenizer 29 can be designed to produce a beam in the shape of a high-aspect rectangle, which is preferred for certain implementations of the SLS process. A more detailed description of the principles behind the operation of the homogenizer can be found in U.S. Pat. No. 5,059,013.

The spatially homogenized, self-luminous beam 211 output from the homogenizer 29 is imaged onto the mask 212 by the condenser lens set 213 as illumination beam 214. Mask 212 is held in single-planar stage 215, which contains a window to allow underside illumination of the mask. Mask 212 is preferably fabricated out of radiation-transmissive material commonly referred to as "quartz" (actually man-made fused silica), with features defined by a layer of patterned chrome. For applications where the fluence at the mask exceeds the damage threshold of chrome, a layer of patterned aluminum can be substituted, as can a mask constructed of layers of patterned dielectric materials designed to be reflective at the appropriate wavelength.

A significant portion of the mask 212 may be reflective, so a significant portion of beam 214 may be reflected and returned to energy-efficient re-reflecting homogenizer 29. Thus, the homogenizer 29 not only converts the incident laser beam to self-luminous radiation by multiple internal reflections, but also collects reflected radiation from reflective surfaces in the optical path such as the mask 212. After being re-reflected back into the illumination, these become a vastly complex system of radiation sub-beams caroming about within the chamber of the homogenizer 29, wherein they contribute to the spatially uniform self-luminous output. Energy that otherwise would have been lost is recollected and recycled back into the beam. Additionally, the extra trips through the homogenizer 29 augment the spatial uniformization of the beam beyond that provided by a single traversal. For a more-detailed description of the operation of the high-efficiency energy recycler, see U.S. Pat. No. 5,473,408.

The mask pattern is imaged onto the substrate 220 by the imaging system including reverser unit 216, projection lens 217, and fold mirror 218. The patterns and features on mask 212 will vary as appropriate to the particular details of the process being conducted. The portion of the processed beam 214 that encounters a clear area of the mask pattern is mostly unreflected, and passes through the mask 212 as patterned beam 219 and through the reverser unit 216 to the entry of projection lens 217. The reverser unit 216 inverts the image (which is subsequently inverted again by the projection lens 217) so that a non-inverted image of the mask pattern is produced in the image plane at the sample surface. A non-inverted image is required in order to image the large-area mask pattern over an equivalent area of the sample through scanning of the single-planar stage 215. The projection lens 217, with the aid of fold mirror 218, images the mask features onto substrate 220.

The beam transmitted by the beam-splitter 23 passes into the non-imaging branch 25, and through beam-shaping module 221, homogenizer 222, and condenser optics 223. All of the components of the non-imaging branch illumination system 27 function analogously to their counterparts on the imaging branch 26. The condenser optics 223 image the spatially uniform output of the homogenizer 222 onto the sample 220 as illumination beam 224. Geometrical constraints on the position of folding mirror 225 dictate that illumination beam 224 intersect the sample obliquely. The optics on the non-imaging branch 25 are designed such that the dimensions of the illumination beam coincide approximately with the image field of the imaging branch 225. A control system 226 will allow for automated operation of the system, and has the capability to control the firing of the laser 21 or lasers, the translation of the scanning platform 215, the division of the beam energy between the imaging 24 and non-imaging 25 branches, and the aspect ratios of the output of the homogenizers.

Figure 3:
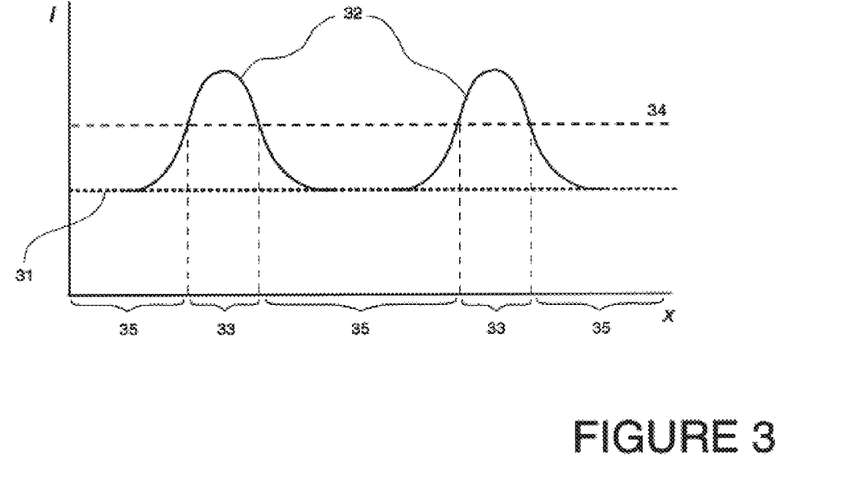
FIG. 3 is a plot of Intensity vs. position showing how the combination of two beams—one imaged and one uniform—can lead to a patterned image of high fluence suitable for laser materials processing.

FIG. 3 is a plot of the beam intensity (fluence) as a function of position, and shows how the superposition of the two beams—one imaged and one not—can provide a high-fluence imaged beam that is suitable for materials processing. The addition of the uniform, non-imaged illumination 31 to the imaged beam 32 raises the fluence in the imaged areas 33 above the threshold 34 for effecting material changes. A large portion of the energy of the imaged pattern actually is absorbed by the substrate in the irradiated zone or zones, effecting the desired physical change in the material. For example, the localized intense heat may effect melting and subsequent resolidification in the irradiated zone or zones as required by the SLS process. Such melting and resolidification is also useful for post-doping annealing of semiconductor thin films. Another useful process that can be treated is patterned laser ablation of various materials.

In the areas where there is no contribution from the imaged beam 35, the background uniform illumination remains below the threshold, and may contribute only to uniform heating of the film. Such heating can be beneficial in certain applications. For example, in SLS, such uniform background heating of the film reduces the lateral thermal gradients between the patterned molten zones and the non-molten zones; in turn, this increases the lateral growth distance, and reduces the propensity for defect formation and substrate damage during solidification.

Figure 4:
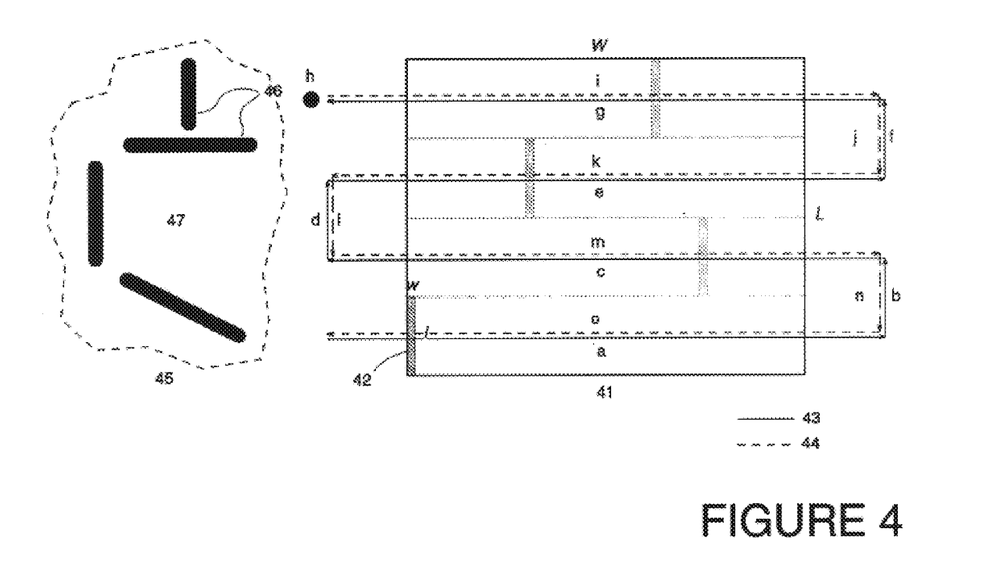
FIG. 4 is a schematic of a two-shot offset scanning scheme for SLS for which the dual-beam, 1:1 materials-processing system described herein is well-suited.

FIG. 4 illustrates a preferred embodiment of a two-beam offset scanning SLS scheme that provides large-grained directionally oriented polycrystalline silicon films (SLS-direction) at high throughput, and for which this equipment is uniquely suited. The single planar stage is scanned is a serpentine pattern such that the entire substrate 41 is exposed. The features on the mask will be imaged onto the substrate with a direct correspondence because of the 1:1 imaging. The beam 42 that is incident on the substrate, which represents the superposition of the imaged and non-imaged beams, is in the shape of a high-aspect-ratio rectangle. This shape is preferred for high throughput because it minimizes the number of stepping motions required to crystallize the entire film. The settling delays associated with stage stepping motions contribute significantly to the total processing time. The beam is scanned in the manner indicated; the various steps and scans are labeled a–o. At the conclusion of the first serpentine scan 43 (comprising steps a–g), the mask is shifted over a small distance—typically one the order of 1 $\mu$m (step h), in accordance with basic SLS principles, and the substrate is irradiated again in a second serpentine scan 44 (comprising steps i–o). The entire process consists of 2L/l scans (e.g., labeled a, c, e, g, i, k, m, and o), where L is the dimension of the substrate and l is the long dimension of the beam; 2(L/l–1) repositioning steps, of distance approximately equal to l, (labeled b, d, f, j, l, and n); and one microshift of the mask in-between scans (labeled h).

Inset 45 shows a detail of a section of a representative mask pattern. The pattern consists of various opaque features 46 on a clear background 47. The shapes, locations, and orientations of the features 46 are matched directly to the desired device layout so as to crystallize exactly those areas where a transistor is to be fabricated.

Figure 5:
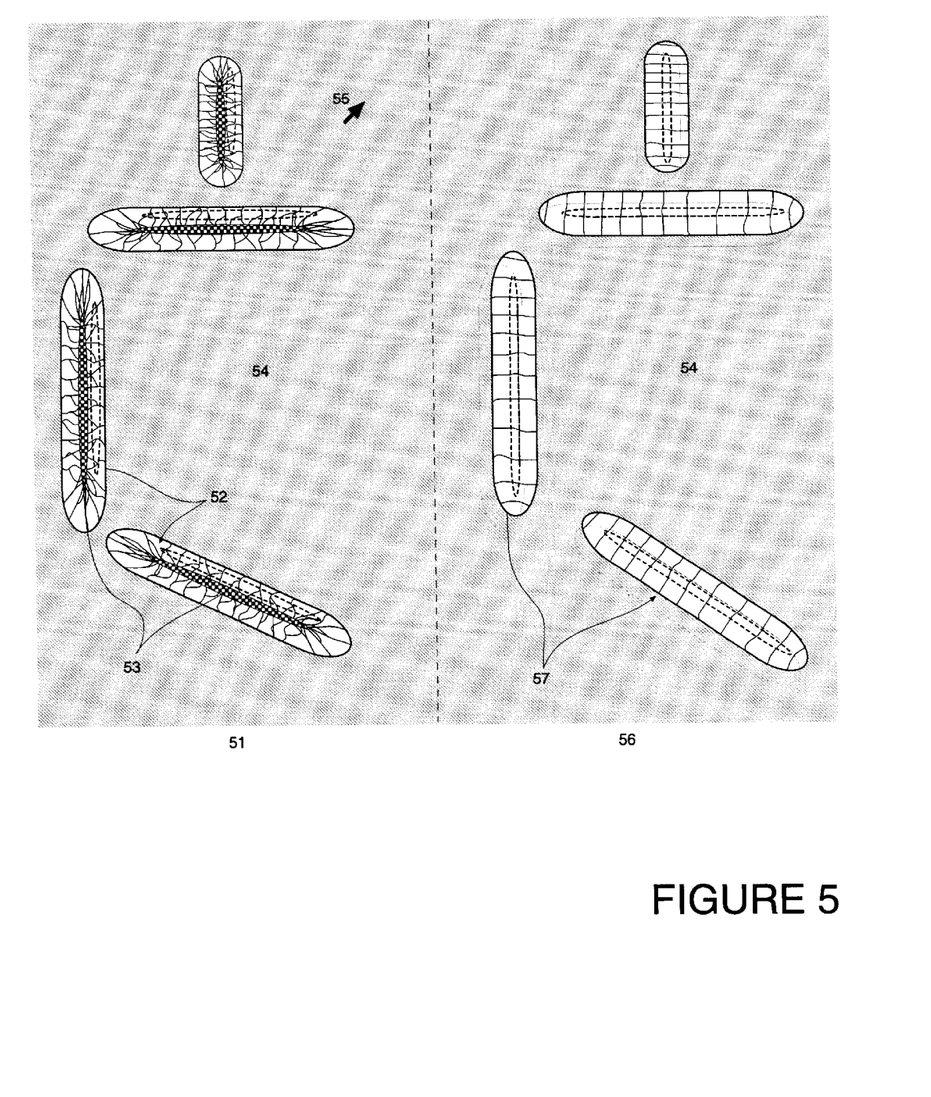
FIG. 5 is a schematic of a thin-film polycrystalline microstructure known as "SLS-directional," which can be used to fabricate high-performance thin-film transistor (TFT) devices, and which can be produced at high throughput using the materials-processing system described herein.

FIG. 5 shows an example of the SLS-directional microstructure that can be obtained via the two-shot offset SLS process. The intermediate microstructure obtained after the first irradiation 51 (in the first serpentine scan) is shown on the left. Those areas not occluded by the mask features undergo complete melting and subsequent solidification. The occluded, non-melted areas serve as seeds for super-lateral growth in their immediate vicinity 52. In the occluded areas themselves, the explosive crystallization leads to a very fine grained microstructure 53. Beyond the super-lateral growth distance, nucleation of new grains also leads to a fine-grained polycrystalline microstructure 54. The right side of FIG. 5 shows the microstructure obtained after the mask microshift 55 and second irradiation 56 (in the second serpentine scan). The previously grown large-grained crystals serve as seeds for a second instance of super-lateral growth, leading to the SLS-directional microstructure. The predominant orientation within each crystallized region 57 is determined by the mask features, and can be optimized relative to the device layout.

The exact positions and orientations of the grain boundaries in the SLS-directional microstructure can be manipulated via the mask design, and matched to the layout of the devices on a device-by-device basis. Through proper optimization of the grain boundary placement, the number of grain boundaries located within the active channel of each device can be minimized and made uniform from one device to the next, thus providing higher performance and uniformity than is available with SLS-poly material. Although it is possible, in principle, to produce SLS-directional material using conventional SLS equipment, such a combination is highly inefficient, requiring a step-and-repeat SLS scheme that leads to impractically low throughput. In contrast, the system described herein, when used in conjunction with the offset two-shot scanning scheme, can provide the material at high throughput.

Figure 6:
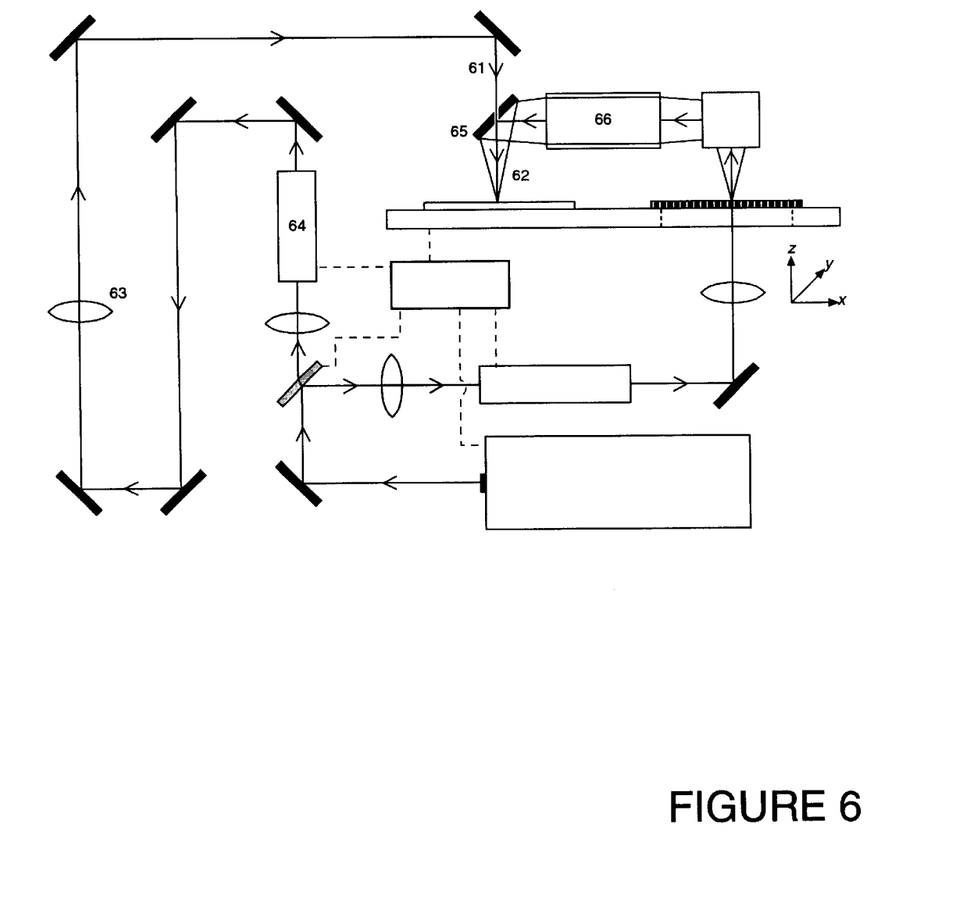
FIG. 6 is a schematic of an alternate configuration of the dual-beam 1:1 materials-processing system that provides coincident irradiation by the two beams using a single laser.

FIG. 6 shows another preferred embodiment of the invention. The system depicted in FIG. 6 is similar to that shown in FIG. 2. It contains the same sub-components, and operates under the same basic principles, as described above, with the exception that, unlike in the system of FIG. 2 where the non-imaged beam intersected the sample at an oblique angle, here, the non-imaged beam 61 intersects the sample normally, coincident with the imaged beam 62. This is advantageous because it is expected to provide a more-uniform illumination of the sample than is possible with oblique incidence. The underlying reason is that the condenser optics 63 function to image the spatially uniform output of the homogenizer 64 onto the substrate. With oblique incidence, the image plane of the condenser optics does not coincide with the sample plane; the result is that the spatial intensity uniformity will be degraded. With normal incidence, this problem is eliminated, and maximum spatial intensity uniformity is achieved.

In order to allow coincidence of the two beams, a hole is provided in folder mirror 65 to allow passage of the non-imaged beam. The numerical aperture (NA) of the imaging branch is large—for example approximately 0.2 for 1-$\mu$m resolution. Geometrically, this means that the cone of rays coming from the projection lens 66 and forming the image will be wide, and the small occlusion in the field presented by the hold in the folding mirror 65 will not degrade the imaging capabilities of the system to any appreciable degree. Conversely, the non-imaging branch is designed so as to have a very low NA so that the source image formed by the condenser 63 can pass through a very narrow aperture in the fold mirror 65. Since no features are being imaged by the non-imaging branch, a high NA is not required. A consequence of the low NA is that the focal length of the condenser optics 63 has to be long. FIG. 6 illustrates how the optical path has been lengthened to accommodate the long focal length of the condenser optics 63.

Figure 7A:
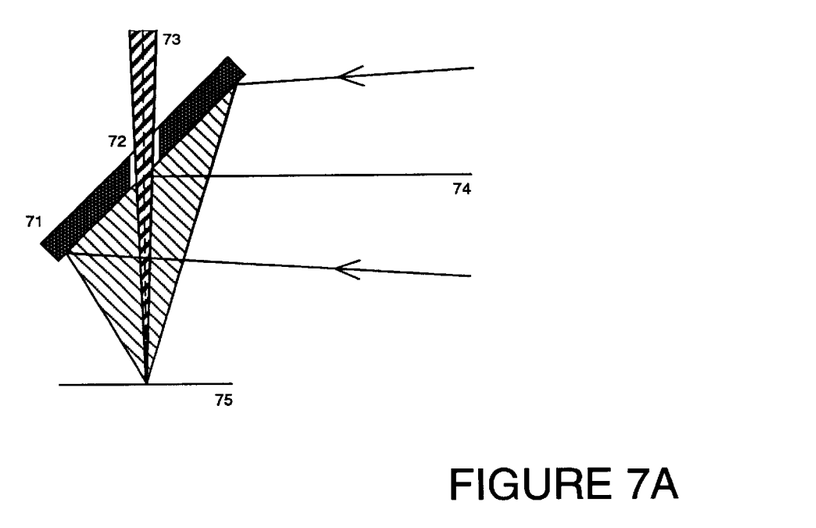

FIG. 7 shows two possible configurations for the hole in the fold mirror. In FIG. 7A, the fold mirror 71 contains a physical hole 72, which allows the low-NA rays from the non-imaging beam 73 to pass unobstructed, while the high-NA cone of rays 74 from the imaging beam is reflected onto the sample 75. The rays lost from the image-forming cone are negligible because of the relatively small area obscured by the hole 72, and do not degrade the image quality to any appreciable degree.

Figure 7B:
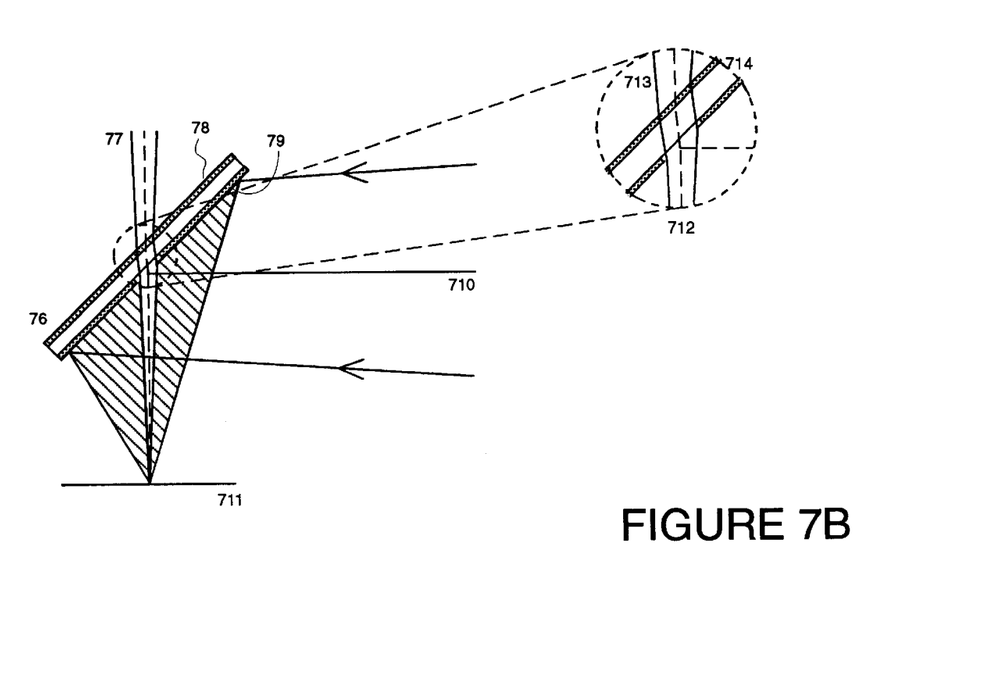

In FIG. 7B, an optical hole in the fold mirror 76—rather than a physical hole—allows passage of the non-imaging beam 77 through the fold mirror. The backside of the fold mirror contains an anti-reflective (AR) coating 78 that allows the mirror to transmit the beam 77 with minimal losses due to reflection. On the front face of the mirror, a reflective coating 79 covers an annular region of the mirror face, and reflects the majority of the rays from the imaging beam 710 onto the sample 711 to form the image. The central region of the mirror face does not contain a coating and thus forms an optical hole through which the non-imaging beam can pass. Inset 712 shows how refraction will induce a slight shift of the non-imaging beam 713 as it passes through the fold mirror 714.

Figure 8:
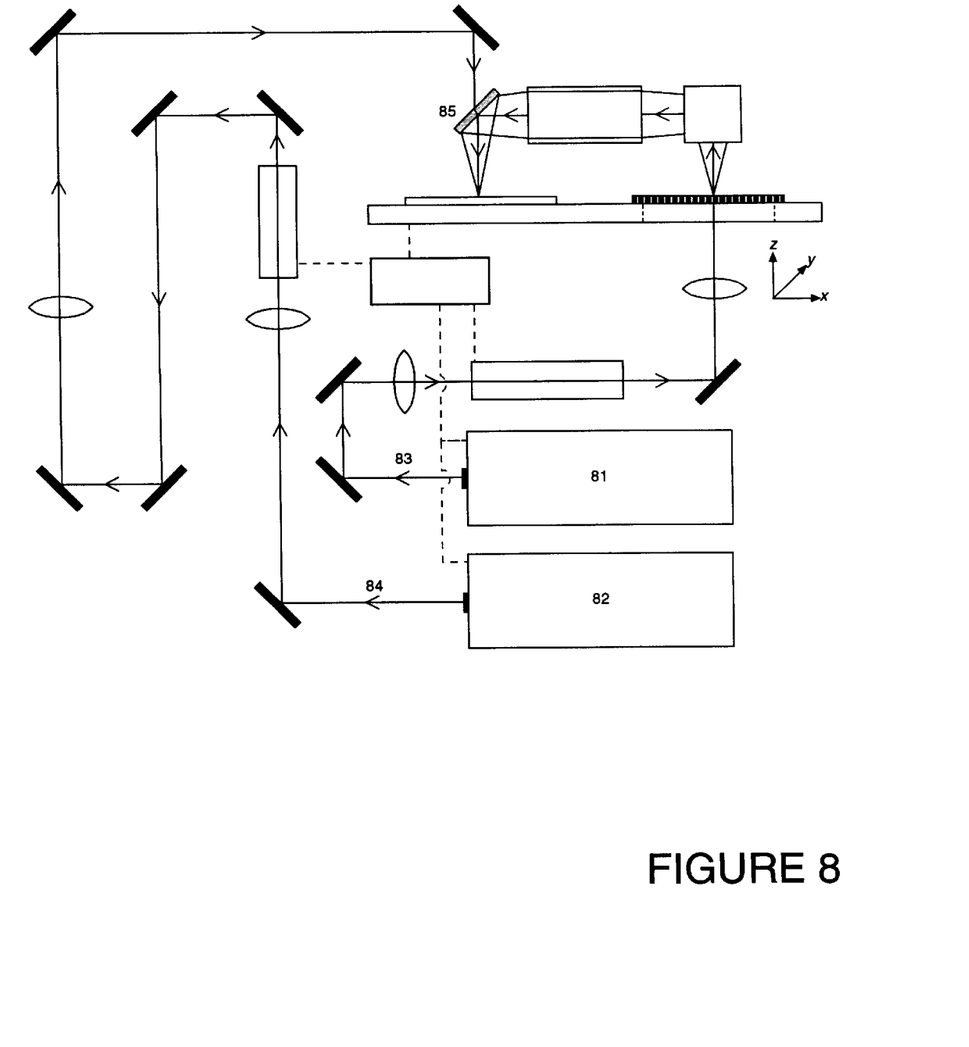
FIG. 8 is a schematic of an alternate configuration of the dual-beam 1:1 materials-processing system that provides coincident irradiation by two beams using two lasers operating at different wavelengths.

FIG. 8 shows another embodiment of the invention. Here two lasers 81 and 82 are used to generate two separate beams 83 and 84, respectively. In this embodiment, no beam-splitter is required because the imaging and non-imaging paths are completely separate until being combined at the fold mirror 85. The important feature is that the two lasers operate at different wavelengths, for example, the laser that feeds the imaging path 81 could be an excimer laser operating at 308 nm, whereas the laser that feeds the non-imaging path 82 could be an excimer laser operating at 248 nm. The fact that the two beams operate at different wavelengths facilitates their combination at the fold mirror 85, which has a dichroic coating that reflects the imaging wavelength and transmits the non-imaging wavelength. There are a number of additional benefits of this embodiment, including the relative simplicity of designing an imaging system to operate at 308 nm compared with 248 nm, or shorter wavelengths. The lifetime of the optics will also be extended for a given fluence when operating at 398 nm vs. 248 nm. Conversely, if the non-imaging path uses 308 nm, all of its optical components would be more tolerant of the high-fluence radiation than if 248 nm were used. An additional benefit, regardless of which wavelengths are chosen for the two paths, is that a given level of fluence can be achieved using a combination of small-to medium-power lasers rather than a single high-power laser, reducing the system cost.

Figure 9A:
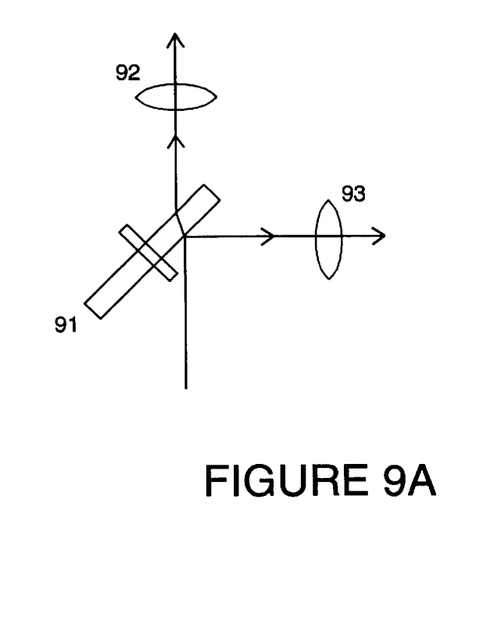

FIG. 9 shows several concepts for a variable beam-splitter (VBS), which can be used in conjunction with the embodiments described in FIGS. 2 and 6. FIG. 9A shows how VBS 91 is used to divide the beam energy among two paths: transmitted 92 and reflected 93, which can coincide with the non-imaging (or "flood") path and the imaging path, respectively. Alternately, the transmitted beam can be used as the imaging path and the reflected beam as the non-imaging path. The VBS 91 differs from a simple beam-splitter in that the ratio of the energy in the transmitted beam to that in the reflected beam can be easily adjusted.

Figure 9B:
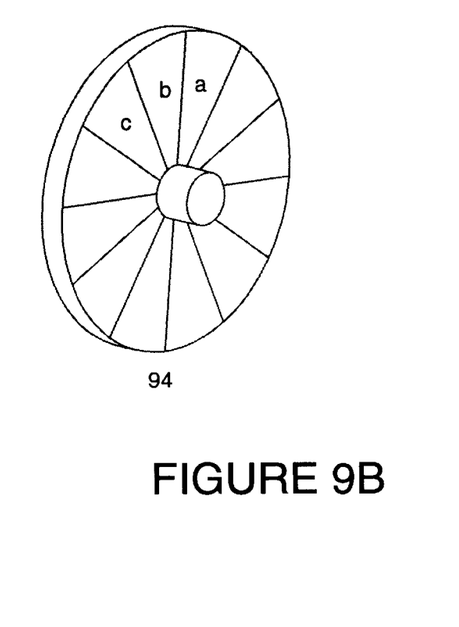

One concept for the VBS is shown in FIG. 9B. The VBS 94 takes the form of a rotating wheel divided into various sectors a, b, c, etc. Each sector contains a dielectric coating designed to transmit and reflect specific amounts of beam energy. For example, sector "a" might transmit 10%, reflect 90%; sector "b" might transmit 20%, reflect 80%, etc. By rotating the appropriate sector into the beam path, the desired split in energy among the imaging and non-imaging beam paths could be effected. Such capability would be valuable in process optimization; generally, it would be desirable to route as little energy as is practical through the imaging branch while maintaining the background level of illumination below the material's transformation threshold, and also while maintaining an acceptable signal-to-noise ratio in the imaged intensity profile. Such a device could be automated through the use of a stepper motor, and would lend itself to computer control and automation.

Figure 9C:
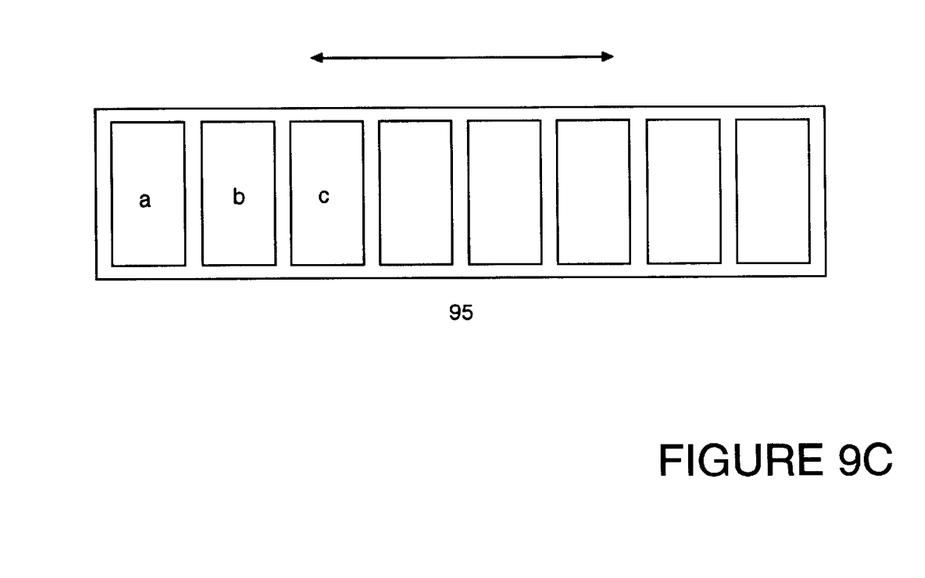

Another concept for the VBS is shown in FIG. 9C. Here, the VBS 95 takes the form of a linear slide with various windows a, b, c, etc. Each window contains a separate beam-splitter plate with a particular split between the transmitted and reflected energies. The desired imaging/non-imaging beam energy ratio can be obtained by positioning the slide such that the appropriate plate is in the beam path.

Yet another concept for the VBS is to use a modified energy attenuator. The principal component of an attenuator is an optical plate, typically fabricated out of fused silica, with a multilayer dielectric coating on one side, and an AR coating for the appropriate wavelength on the other. The multilayer dielectric coating is designed to render the transmission of the plate variable depending on the angle of the plate relative to the optic axis (i.e., the angle at which the beam intersects the plate). By rotating the plate, the transmitted portion of the beam can be varied, with the remainder of the beam reflected into a beam dump. For the application of the attenuator as a VBS, the reflected beam is used to feed one of the optical paths—either the imaging or non-imaging branch—rather than dumped.

SYSTEM DESIGN EXAMPLE

Table 1 gives specifications for a representative system utilizing a single high-power excimer laser. Two variations are given; they differ in the division of beam energy between the imaging and non-imaging branch, which can be easily adjusted if the system is equipped with a VBS. The total fluence increases as the relative amount of energy routed through the non-imaging system, which has a higher optical efficiency because it contains fewer optical elements. The system is designed for high-resolution (1-$\mu$m) imaging, as well as for high fluence (>1 J/cm$^2$ at the sample).

TABLE 1

| System Specifications Example | | |
|---|---|---|
| Laser Energy | 670 mJ/pulse | |
| Imaging/non-imaging beam energy ratio | 40%/60% | 20%/80% |
| Optical efficiency of imaging branch | 50% | |
| Numerical aperture (NA) of imaging system | 0.2 | |
| Resolution of imaging system | 1 $\mu$m | |
| Image field size | 16 mm × 1.5 mm | |
| Imaged beam fluence at sample | 554 mJ/cm$^2$ | 277 mJ/cm$^2$ |
| Optical efficiency of non-imaging branch | 70% | |
| Illumination field size | 16 mm × 1.5 mm | |
| Flood illumination fluence at sample | 1,167 mJ/cm$^2$ | 1,556 mJ/cm$^2$ |
| Maximum total fluence | 1,720 mJ/cm$^2$ | 1,833 mJ/cm$^2$ |

What is claimed is:

1. A processing system, for treating materials by radiation, comprising:
   a) radiation source means producing a plurality of beams, at least one being an imaging beam and at least one being a non-imaging beam, each such beam having fluence alone below the threshold for effecting treatment of a substrate surface of selected target material, but said plurality of beams when overlapped having aggregate fluence for effecting treatment of said target material;
   b) an imaging beam conditioning subsystem, for accepting said beam and delivering a conditioned imaging beam having the following:

defined size and shape,
uniform spatial intensity profile,
self luminosity,
defined numerical aperture,
defined temporal characteristics; and
near-telecentricity;

c) means for positioning a mask having a pattern, with relation to said imaging beam conditioning subsystem such that said conditioned imaging beam is incident upon the mask, transmitting the pattern only;

d) means for presenting a substrate at a substrate surface treatment station;

e) a projection imaging subsystem, for producing an image of the mask pattern of said mask onto a substrate at said substrate treatment station;

f) a non-imaging beam conditioning subsystem for accepting said non-imaging beam and delivering a conditioned background non-imaging beam on an area of the substrate encompassing the imaging beam of said imaging beam conditioning subsystem, having the following:
defined size and shape, and
uniform spatial intensity profile;

g) background non-imaging means, of defined numerical aperture, for producing a background non-imaging field onto the substrate at said substrate treatment station, said background field being positioned to overlap the mask pattern at said substrate surface treatment station; and h) control means for operating said radiation source, said imaging beam conditioning subsystem, said non-imaging beam subsystem, and said substrate presentation means, to provide a patterning image by said imaging beam overlapping a simultaneous non-imaging beam to provide over-threshold fluence for treating the substrate surface material.

2. A processing system, for treating materials by radiation, according to claim 1, wherein said projection imaging subsystem comprises a projection lens of substantially 1:1 magnification.

3. A processing system, for treating materials by radiation, according to claim 1, wherein said non-imaging beam conditioning subsystem provides a background beam oblique to said substrate at said substrate imaging station.

4. A processing system, for treating materials by radiation, according to claim 3, wherein said projection imaging subsystem provides a folded image path.

5. A processing system, for treating materials by radiation, according to claim 3, wherein said means for presenting a substrate at a substrate imaging station comprises a stage having a platform holding both substrate and mask, and said projection imaging subsystem provides a folded image path comprising a reverser, a substantially 1:1 projection lens, and a fold mirror.

6. A processing system, for treating materials by radiation, according to claim 5, wherein said imaging beam conditioning subsystem has a finite beam path length and said non-imaging beam conditioning subsystem has a significantly greater beam path length.

7. A processing system, for treating materials by radiation, according to claim 6, wherein said non-imaging beam conditioning subsystem has extra folding elements to provide the much greater beam path length.

8. A processing system, for treating materials by radiation, according to claim 2, wherein said non-imaging beam is incident on a substrate surface in said substrate surface treatment station collinearly with said imaging beam.

9. A processing system, for treating materials by radiation, according to claim 8, wherein said non-imaging beam passes only through the final one of the imaging system folding components.

10. A processing system, for treating materials by radiation, according to claim 9, wherein said non-imaging beam passes through one of the imaging system folding components through a physical opening.

11. A processing system, for treating materials by radiation, according to claim 9, wherein said non-imaging beam passes through one of the imaging system folding components through a optically transmitting patch in a reflective coating.

12. A processing system, for treating materials by radiation, according to claim 9, wherein said non-imaging beam passes through one of the imaging system folding components, with minimum degradation of the imaging beam pattern because of the relatively small portion of the folding component affected.

13. A processing system, for treating materials by radiation, comprising:

a) a single laser and optical beam-splitter means producing a having a plurality of beams, at least one being an imaging beam and at least one of said beams being a non-imaging beam, each such beam having fluence alone below the threshold for effecting treatment of a substrate surface of selected target material, but said plurality of beams when overlapped having aggregate fluence for effecting treatment of said target material;

b) an imaging beam conditioning subsystem for accepting said beam and delivering a conditioned imaging beam having the following:
defined size and shape,
uniform spatial intensity profile,
self luminosity,
defined numerical aperture,
defined temporal characteristics; and
near-telecentricity;

c) means for positioning a mask having a pattern, with relation to said imaging beam conditioning subsystem such that said conditioned imaging beam is incident upon the mask, transmitting the pattern only;

d) means for presenting a substrate at a substrate surface treatment station;

e) projection imaging means, of defined numerical aperture, for producing an image of the mask pattern of said mask onto a substrate at said substrate treatment station;

f) a non-imaging beam conditioning subsystem for accepting said non-imaging beam and delivering a conditioned background non-imaging beam encompassing the imaging beam of said imaging beam conditioning subsystem, having the following:
defined size and shape, and
uniform spatial intensity profile;

g) background non-imaging means, of defined numerical aperture, for producing a background non-imaging field onto a substrate at said substrate treatment station, said background field being positioned to overlap the mask pattern at said substrate treatment station; and h) control means for operating said radiation source, said imaging beam conditioning subsystem, and said non-imaging beam subsystem to provide a patterning image by said imaging beam overlapping a simultaneous non-imaging beam to provide over-threshold fluence for effecting the material.

14. A processing system, for treating materials by radiation, according to claim 13, wherein:
said optical beam-splitter is a variable beam splitter.

15. A processing system, for treating materials by radiation, according to claim 14, wherein:
said variable optical beam-splitter has multiple fields of differing beam-splitting ratios, positionable in the beam path by rotation about an axis.

16. A processing system, for treating materials by radiation, according to claim 14, wherein:
said variable optical beam-splitter has multiple fields of differing beam-splitting ratios, positionable in the beam path by sliding along a slide path.

17. A processing system, for treating materials by radiation, according to claim 14, wherein:
said variable optical beam-splitter has a socket for holding a beam-splitting element, selected from a set of beam-splitting elements having differing beam-splitting ratios, positionable in the beam path by placement in said socket.

18. A processing system, for treating materials by radiation, according to claim 14, wherein:
said control means selects beam-splitter ratios.

19. A processing system, for treating materials by radiation, comprising:
a) radiation source means emitting radiation beams of differing wavelengths, and a frequency-selective beam-splitter for separating and combining said plurality of beams, at least one of said beams being an imaging beam and at least one of said beams being a non-imaging beam, each such beam having fluence alone below the threshold for effecting treatment of a substrate surface of selected target material, but said plurality of beams when overlapped having aggregate fluence for effecting treatment of said target material;
b) an imaging beam conditioning subsystem for accepting said beam and delivering a conditioned imaging beam having the following:
defined size and shape,
uniform spatial intensity profile,
self luminosity,
defined numerical aperture,
defined temporal characteristics; and
near-telecentricity;
c) means for positioning a mask having a pattern, with relation to said imaging beam conditioning subsystem such that said conditioned imaging beam is incident upon the mask, transmitting the pattern only;
d) means for presenting a substrate at a substrate surface treatment station;
e) projection imaging means, of defined numerical aperture, for producing an image of the mask pattern of said mask onto a substrate at said substrate treatment station;
f) a non-imaging beam conditioning subsystem for accepting said non-imaging beam and delivering a conditioned background non-imaging beam encompassing the imaging beam of said imaging beam conditioning subsystem, having the following:
defined size and shape, and
uniform spatial intensity profile;
g) background non-imaging means, of defined numerical aperture, for producing a background non-imaging field onto a substrate at said substrate treatment station, said background field being positioned to overlap the mask pattern at said substrate treatment station; and
h) control means for operating said radiation source, said imaging beam conditioning subsystem, and said non-imaging beam subsystem to provide a patterning image by said imaging beam overlapping a simultaneous non-imaging beam to provide over-threshold fluence for effecting the material.

20. A processing system, for treating materials by radiation, according to claim 19, wherein:
the resonant frequencies of said radiation source means are 248 nm and 308 nm.

21. A processing system, for treating materials by radiation, according to claim 19, wherein:
the shorter-wavelength, higher resonant frequency, beam of said beams from said radiation source means is assigned to the imaging beam.

22. A processing system, for treating materials by radiation, according to claim 21, wherein:
the imaging beam branch has a higher numerical aperture and a shorter focal length.

23. A processing system, for treating materials by radiation, according to claim 19, wherein:
the higher resonant frequency beam of said beams from said radiation source means is assigned to the non-imaging beam.

24. A processing system, for treating materials by radiation, according to claim 23, wherein:
the lower resonant frequency beam of said beams from said radiation source means is assigned to the imaging beam and the non-imaging beam branch has a lower numerical aperture and a longer focal length.

25. A processing system, for treating materials by radiation, according to claim 1, wherein:
said radiation source means comprises a plurality of lasers.

26. A processing system, for treating materials by radiation, according to claim 1, wherein:
said radiation source means comprises a plurality of lasers differing in resonant wavelengths.

27. A processing system, for treating materials by radiation, according to claim 1, wherein:
said radiation source means comprises a plurality of lasers of the same resonant wavelength differing in fluence, with the greater fluence laser being assigned to produce the non-imaging beam.

28. A processing system, for treating materials by radiation, according to claim 1, wherein:
said radiation source means comprises a plurality of lasers of differing resonant wavelengths, with the shorter wavelength laser being assigned to produce the patterning image beam.

29. A processing system, for treating materials by radiation, according to claim 1, wherein:
said radiation source means provides a plurality of laser beams of differing resonant wavelengths, shorter and longer, with the shorter wavelength laser being assigned to produce the patterning image beam, reflected directly by a folding element which has a dichroic coating reflecting the shorter wavelength and passing the longer wavelength, and the longer wavelength beam being assigned to produce the non-imaging beam, so that the patterned imaging beam passes directly into the imaging path to reach the substrate surface by reflection and the non-imaging beam passes through the said folding element to reach the substrate surface.

30. A processing system, for treating materials by radiation, according to claim 1, wherein:

said radiation source imaging beam and said non-imaging beam have a fluence ratio significantly less than 1:1 and an aggregate fluence greater than the treatment threshold of the substrate surface material selected, so that the more powerful non-imaging beam follows a beam path devoid of delicate, high-resolution elements, and the lesser-fluence imaging beam does not adversely damage the delicate, high-resolution elements in the imaging beam path.

31. The method of surface processing of a substrate with radiation, using a mask, at substantially 1:1 magnification at which there is a significant likelihood of mask damage at the high fluence levels required, characterized by the following steps:

1) providing a patterned mask;
2) providing a folded, high numerical aperture, imaging beam path passing through the mask to a treatment area on the surface of a substrate mounted on a common stage platform with the mask;
3) providing a low numerical aperture, non-imaging, long, beam path, bypassing the mask to the same treatment area on the surface of the same substrate;
4) providing a first radiation beam, the imaging beam, being of fluence below the threshold of damage to the mask but also being below the threshold of sequential lateral solidification of the substrate;
5) providing a second radiation beam, the non-imaging beam, being of fluence less than the threshold of sequential lateral solidification of the substrate, but with said imaging beam being of aggregate fluence greater than the threshold of sequential lateral solidification of the substrate;
6) directing the imaging beam along an imaging path, of high resolution, through the mask and projection elements to impinge on an image patterning field on a substrate surface at a substrate surface imaging station; and
7) simultaneously directing the non-imaging beam along the non-imaging path, bypassing said mask and said projection elements, to impinge on the identical image patterning field, thus by the aggregate fluence of dual selection by image beam and non-image beam causing sequential lateral solidification of the mask pattern on the substrate, while avoiding damage to mask and projection elements.

32. The method of surface processing of a substrate with radiation, using a mask, at substantially 1:1 magnification, according to claim 31, wherein:

step 7, simultaneously directing the non-imaging beam along the non-imaging path, includes passing the non-imaging beam through a physical hole in an optical element common to both the imaging path and the non-imaging path.

33. The method of surface processing of a substrate with radiation, using a mask, at substantially 1:1 magnification, according to claim 31, wherein:

step 7, simultaneously directing the non-imaging beam along the non-imaging path, includes passing the non-imaging beam through an optical hole in an optical element common to both the imaging path and the non-imaging path.

34. The method of surface processing of a substrate with radiation, using a mask, at substantially 1:1 magnification, according to claim 31, wherein:

steps 4 and 5, providing the imaging beam along the imaging path, and providing the non-imaging beam along the non-imaging path, uses a variable beam-splitter.

35. The method of surface processing of a substrate with radiation, using a mask, at substantially 1:1 magnification, according to claim 31, wherein:

steps 4 and 5, providing the imaging beam along the imaging path, and providing the non-imaging beam along the non-imaging path, provide beams differing in frequency and use a frequency-beam-splitter.

36. The method of surface processing of a substrate with radiation, using a mask, at substantially 1:1 magnification, according to claim 31, wherein:

steps 4 and 5, providing the imaging beam along the imaging path, and providing the non-imaging beam along the non-imaging path, provide beams differing in, and steps 6 and 7 combine the imaging beam and the non-imaging beam by using a dichroic mirror.

* * * * *